US006598216B2

(12) United States Patent
Chan et al.

(10) Patent No.: US 6,598,216 B2
(45) Date of Patent: Jul. 22, 2003

(54) METHOD FOR ENHANCING A POWER BUS IN I/O REGIONS OF AN ASIC DEVICE

(75) Inventors: Francis Chan, Williston, VT (US); Charles S. Chiu, Essex Junction, VT (US); Robert Charles Cusimano, South Hero, VT (US); Donald S. Kent, Essex Junction, VT (US); Gulsun Yasar, S. Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 09/924,673

(22) Filed: Aug. 8, 2001

(65) Prior Publication Data
US 2003/0033578 A1 Feb. 13, 2003

(51) Int. Cl.[7] .............................................. G06F 17/50
(52) U.S. Cl. ................... 716/13; 716/14; 716/2
(58) Field of Search ................... 716/13, 14, 2

(56) References Cited

U.S. PATENT DOCUMENTS

| 4,511,914 | A |   | 4/1985 | Remedi et al. ............. 257/203 |
| 4,612,618 | A | * | 9/1986 | Pryor et al. ................... 716/10 |
| 5,311,058 | A |   | 5/1994 | Smolley ..................... 257/691 |
| 5,378,925 | A |   | 1/1995 | Sasaki ........................ 257/691 |
| 5,483,461 | A | * | 1/1996 | Lee et al. ...................... 716/14 |
| 5,544,088 | A | * | 8/1996 | Aubertine et al. ............. 716/13 |
| 5,598,348 | A | * | 1/1997 | Rusu et al. ...................... 716/2 |
| 5,648,912 | A | * | 7/1997 | Narayanan et al. ........... 716/18 |
| 5,668,389 | A |   | 9/1997 | Jassowski et al. .......... 257/207 |
| 5,793,643 | A | * | 8/1998 | Cai ............................. 716/12 |
| 5,923,089 | A |   | 7/1999 | Yao et al. ................... 257/775 |
| 6,091,090 | A |   | 7/2000 | Gheewala ................... 257/211 |
| 6,111,804 | A |   | 8/2000 | Borkar ........................ 365/206 |
| 6,115,279 | A |   | 9/2000 | Kitsukawa et al. ........... 365/63 |
| 6,360,356 | B1 | * | 3/2002 | Eng ............................. 716/18 |
| 6,370,678 | B1 | * | 4/2002 | Culler ......................... 716/18 |
| 6,397,375 | B1 | * | 5/2002 | Block et al. ................... 716/14 |
| 6,421,816 | B1 | * | 7/2002 | Ishikura ......................... 716/7 |
| 6,421,818 | B1 | * | 7/2002 | Dupenloup et al. ........... 716/18 |
| 6,449,760 | B1 | * | 9/2002 | Tetelbaum et al. ............ 716/10 |
| 6,480,989 | B2 | * | 11/2002 | Chan et al. .................... 716/8 |
| 6,480,996 | B1 | * | 11/2002 | Aji et al. ...................... 716/12 |

(List continued on next page.)

OTHER PUBLICATIONS

Sengupta et al., "Minimizing area and maximizing porosity for cell layouts using innovative routing strategies", Fourteenth International Conference on VLSI Design, Jan. 3, 2001, pp. 353–358.*

Hauck et al., "Pin Assignment for Multi–FPGA Systems", IEEE Transactions on Computer–Aided Design of Integrated Circuits and Systems, vol. 16, No. 9, Sep. 1997, pp. 956–964.*

(List continued on next page.)

Primary Examiner—Matthew Smith
Assistant Examiner—Phallaka Kik
(74) Attorney, Agent, or Firm—Richard A. Henkler; Bracewell & Patterson, L.L.P.

(57) ABSTRACT

A method for enhancing power bus for I/O libraries in ASIC designs is disclosed. An I/O assignment for I/O circuits to be utilized in an ASIC design is initially generated. Each I/O circuit may obtain power from either a primary I/O power bus or a secondary I/O power bus. A determination is then made as to whether or not the I/O assignment meets certain predetermined power distribution requirements. In a determination that the I/O assignment does not meet the predetermined power bus distribution requirements, a power enhancement cell is added. The power enhancement circuit includes at least one metal line for connecting the primary I/O power bus to the secondary I/O power bus in order for the I/O assignment to meet the power bus distribution requirements.

4 Claims, 6 Drawing Sheets

U.S. PATENT DOCUMENTS

| | | | | |
|---|---|---|---|---|
| 6,499,134 | B1 | * | 12/2002 | Buffet et al. ................... 716/12 |
| 6,502,225 | B2 | * | 12/2002 | Ishikura ......................... 716/7 |
| 6,502,226 | B2 | * | 12/2002 | Ishikura ......................... 716/7 |
| 2001/0049813 | A1 | * | 12/2001 | Chan et al. ..................... 716/8 |
| 2002/0083405 | A1 | * | 6/2002 | Ishikura ......................... 716/7 |
| 2002/0095646 | A1 | * | 7/2002 | Ohkubo ......................... 716/6 |
| 2002/0112212 | A1 | * | 8/2002 | Cohn et al. ..................... 716/1 |
| 2002/0162079 | A1 | * | 10/2002 | Igarashi ......................... 716/2 |
| 2002/0166100 | A1 | * | 11/2002 | Meding ......................... 716/5 |
| 2002/0170020 | A1 | * | 11/2002 | Darden et al. ................. 716/2 |

OTHER PUBLICATIONS

Her et al., "On Over–the–Cell Channel Routing with Cell Orientations Consideration", IEEE Transactions on Computer–Aided Design of Integrated Circuits and Systems, vol. 14, No. 6, Jun. 1995, pp. 766–772.*

Huang et al., "Improved Gate Matrix Layout", IEEE Transactions on Computer–Aided Design, vol. 8, No. 8, Aug. 1989, pp. 875–889.*

Stanisic et al., "Mixed–signal noise–decoupling via simultaneous power distribution design and cell customization in RAIL", Proceedings of the IEEE 1994 Custom Integrated Circuits Conference, May 1, 1994, pp. 533–536.*

Williamson et al., "Ground noise estimation and minimization in integrated circuit packages", 1993 IEEE International Symposium on Electromagnetic Compatibility, Aug. 9, 1993, pp. 425–428.*

Shrivastava, "Inductance calculation and optimal pin assignment for the design of pin–grid–array and chip carrier packages", IEEE Transactions on Components, Hybrids, and Manufacturing Technology, vol. 13, No. 1, Mar. 1990, pp. 147–153.*

Hirano et al., "Characterization and reduction of simultaneous switching noise for a multilayer package", Proceedings of $44^{th}$ Electronic Components and Technology Conference, May 1, 1994, pp. 949–956.*

* cited by examiner

METHOD FOR ENHANCING A POWER BUS IN I/O REGIONS OF AN ASIC DEVICE

BACKGROUND OF THE INVENTION

1. Technical Field

The present invention relates to integrated circuit designs in general, and in particular to application specific integrated circuit (ASIC) designs. Still more particularly, the present invention relates to a method for enhancing a power bus in input/output regions of an ASIC device.

2. Description of the Related Art

Generally speaking, there are two types of integrated circuit (IC) devices according to the types of market to which they are sold. The first type of IC devices is referred to as commodity IC devices and the second type of IC devices is referred to as application specific IC (ASIC) devices. Because commodity IC devices, such as dynamic random access memories, can be sold in vast quantities to a large number of customers, dedicated mask sets are typically employed to fabricate commodity IC devices. The relatively large one-time or non-recurring engineering costs associated with the design and layout of dedicated mask sets can typically be justified by the extremely large number of units over which the non-recurring costs can be distributed.

In contrast, ASIC devices refer to, as the name implies, devices that are customized for the needs of a particular application or a particular customer. Because of the inherently limited market associated with ASIC devices, non-recurring engineering costs have a more dramatic impact on the per-unit cost for each ASIC device. In order to keep the non-recurring costs low, ASIC design methodology is highly structured and highly dependent upon reuse of building block components in order to be cost and resource efficient. Templates for top-level chip power bus and chip-to-package interconnect are one example of building block component reuses. Top-level chip power templates typically define the size of a chip, locations of all interconnect points between the chip and its package, the layout of the power bus system for the chip, and the physical area where input/output (I/O) circuits can be placed on the chip. Most ASIC libraries have a standard set of templates, which includes top-level chip power templates, that are expected to be used on the majority of customer designs. A template is chosen by an ASIC designer based on quantity of logic, number of I/O circuits, expected power dissipation, and performance requirements. The template decision is made no later than when the technology dependent gate level description of a logic model needs to be combined with the I/O circuit placement information for floor planning and timing. From an ASIC designer's point of view, the optimal I/O placement is where there is a short, direct path between the I/O circuit and the logic connected to the I/O circuit. Unfortunately, the ASIC designer must also consider the I/O supply voltages needed, I/O power requirements, power bus, electromigration and I/O noise issues. These constraints often provide difficulties for the ASIC designer to place I/O circuits in an optimal fashion.

For example, current ASIC technologies provide the ability to have a secondary power supply voltage, in addition to a primary power supply voltage, in the I/O area of a peripheral footprint chip. Such ability allows an ASIC designer the flexibility of using industry standard I/O circuits that require a supply voltage other than the primary internal logic voltage. In order to provide such dual power bus flexibility, the power bus metal widths have to be limited to support double power buses within a fixed amount of silicon area. The result is reduced current carrying capability on each of the two power buses. This is not a problem when most ASIC designers are assumed to use both the primary and the secondary I/O power supply voltages that split the current amount required from those two power buses. However, there are many situations when the ASIC designer uses I/O circuits that only require the primary supply voltage. In those situations, it may be necessary to electrically enhance the primary supply bus in order to meet the I/O current demands. Consequently, it would be desirable to provide a method for enhancing a power bus in ASIC designs without incurring the cost of chip template customization.

SUMMARY OF THE INVENTION

In accordance with a preferred embodiment of the present invention, an I/O assignment for I/O circuits to be utilized in an ASIC design is initially generated. Each I/O circuit may obtain power from either a primary I/O power bus or a secondary I/O power bus. A determination is then made as to whether or not the I/O assignment meets certain predetermined power distribution requirements. If a group of I/O circuits only uses the primary power supply and there is a determination that the I/O assignment of this group of I/O circuit does not meet the predetermined power bus distribution requirements, a power enhancement circuit is added. The power enhancement circuit includes at least one metal line for connecting the primary I/O power bus to the secondary I/O power bus in order for the I/O assignment to meet the power bus distribution requirements.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF THE PREFERRED EMBODIMENT

Figure 1:
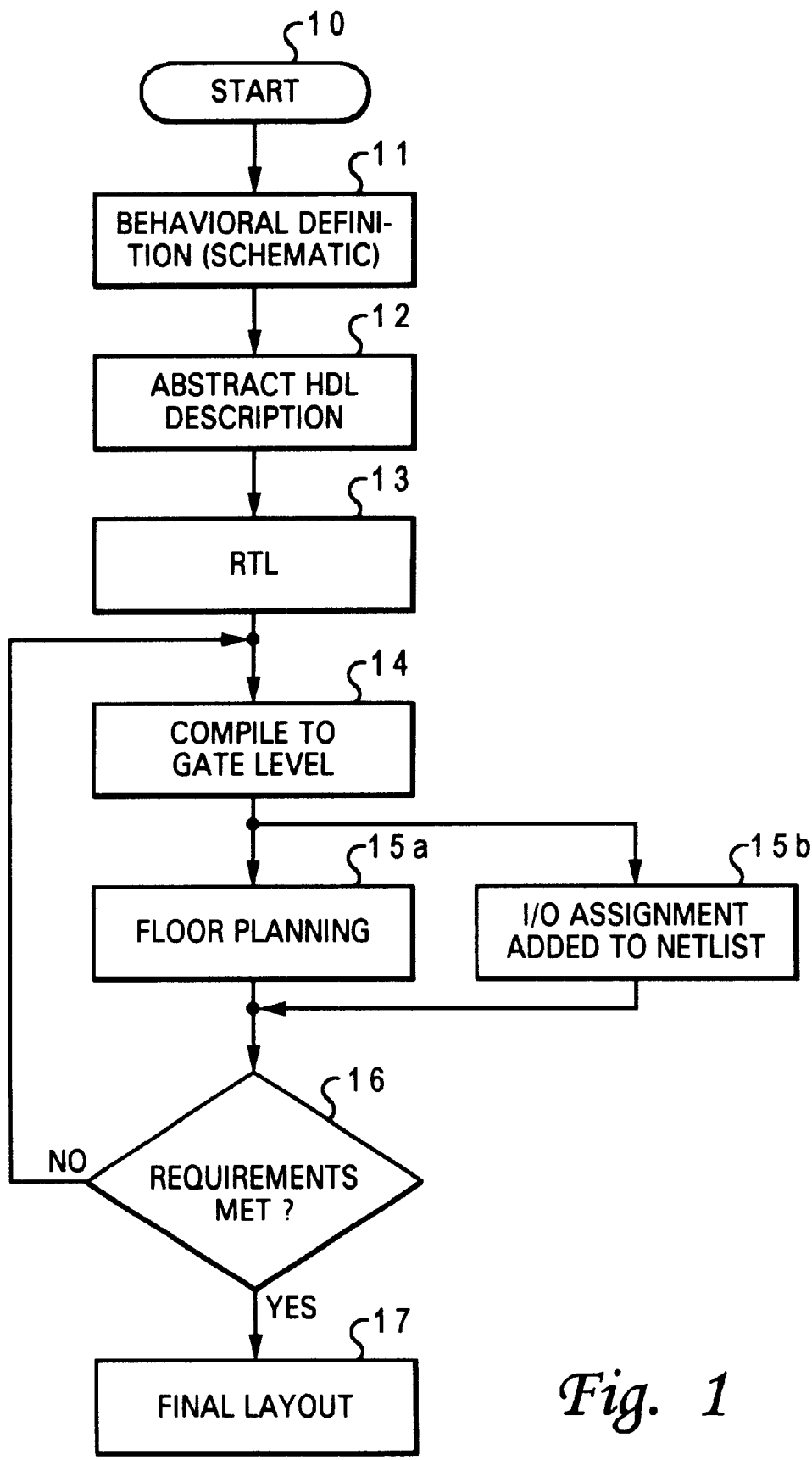
FIG. 1 is a high-level design flow diagram for building an ASIC device, in accordance with a preferred embodiment of the present invention.

Referring now to the drawings and in particular to FIG. 1, there is depicted a high-level design flow diagram for building an application specific integrated circuit (ASIC)

device, in accordance with a preferred embodiment of the present invention. Starting at block 10, the behavior of an ASIC device in an abstract sense is defined, as shown in block 11. At this point of the process, the specific implementation of the ASIC device is left undefined and the interrelationships among various circuit elements that will ultimately define the ASIC device are temporarily ignored in order to achieve a manageable model. The design of the ASIC device may be entered with a schematic capture editor or other suitable tools that are well-known in the art. An ASIC designer then attempts to describe the behavioral model of the ASIC device, as depicted in block 11, with a hardware description language (HDL), as shown in block 12. HDL is a highly specialized software language optimized for describing various elements and the interrelationships among the elements of an electronic device. Well-known HDLs include Verilog HDL and VHDL, as they are familiar to those skilled in the field of integrated circuit design. After the ASIC device has been suitably described in HDL format, a behavioral synthesis tool is employed to produce an register-transfer logic (RTL) representation of the ASIC device, as depicted in block 13. An RTL description represents a lower level of abstraction than the behavioral model without incorporating all of the individual electronic elements that will ultimately comprise the ASIC device. An RTL description, for example, describes the ASIC device in terms of digital registers, clocking circuits, and logic elements that are combined to implement the desired function of the ASIC device.

The RTL description is then compiled into a technology dependent gate level netlist, as shown in block 14. From the RTL description, a gate level description of the ASIC device is achieved through a gate level synthesis. At the gate level, the ASIC device is described in greater detail than in the RTL description using a combination of common logic gates and circuits such as AND gates, OR gates, XOR gates, counters, adders, and other common logic gates. After a gate level description of the ASIC device has been achieved, suitable electronic design automation (EDA) tools can be employed to produce a netlist consisting of the list of circuit elements required to produce the ASIC device and the interconnections among the listed circuit elements.

At this point, the gate level netlist is merged with the I/O placement information in preparation for floor planning, as shown in block 15a. The primary goal of floor planning is to produce an initial layout that can meet timing and has no wiring congestion problems. Floor planning is usually an iterative process back through RTL optimization and compile to gate level netlist, as depicted in block 16. Concurrent with the floor planning process, an electrical analysis of the I/O placement is performed, as shown in block 15b. I/O placement stability is key to minimizing the number of iterations through the floor planning process, so it is important to remedy any I/O placement problems as early as possible. From the netlist, suitable placement and routing programs can be used to layout the ASIC device in an actual physical design that can be achieved with the process technology chosen for the fabrication of the ASIC device, as depicted in block 17. After the physical design has been produced, a mask set is generated and the ASIC device is then fabricated.

Figure 2:
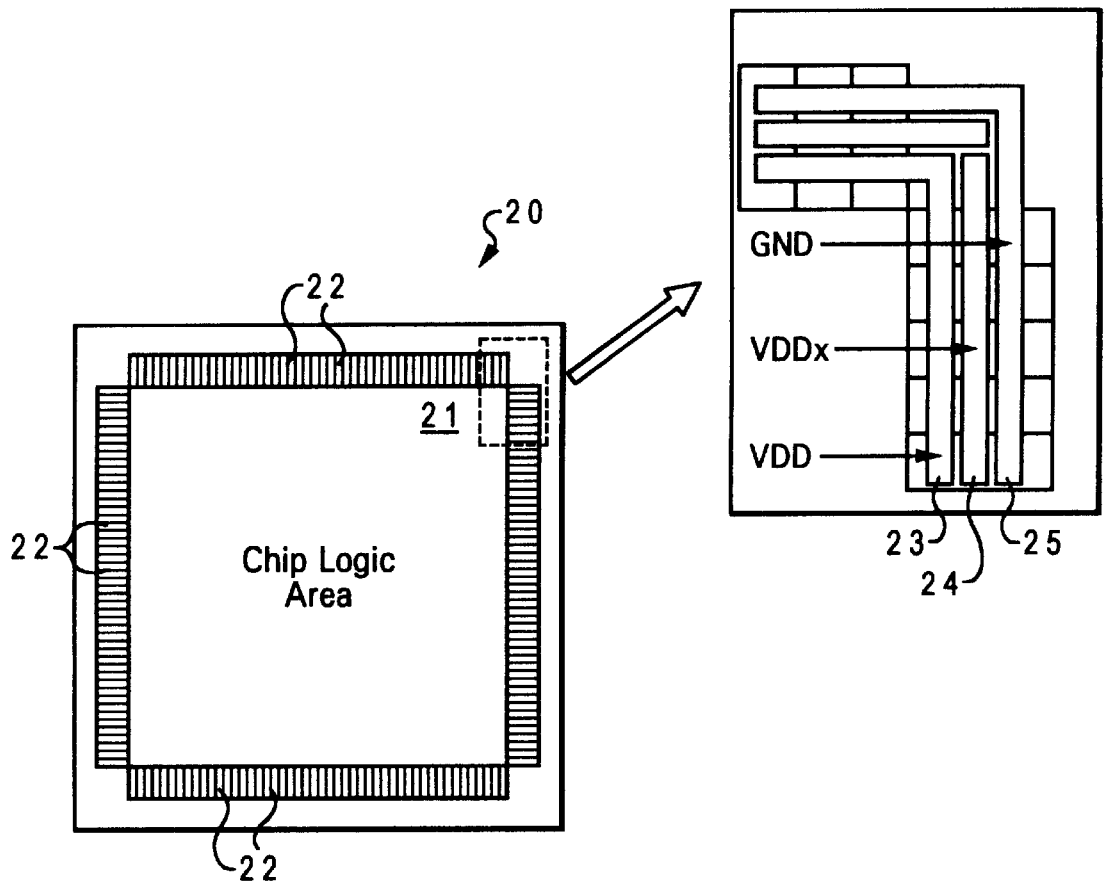
FIG. 2 is a block diagram of an ASIC device, in accordance with a preferred embodiment of the present invention.

With reference now to FIG. 2, there is depicted a block diagram of an ASIC device, in accordance with a preferred embodiment of the present invention. As shown, an ASIC device 20 includes a chip logic area 21 and multiple I/O slots 22 located at the edges of chip logic area 21. Each I/O slot 22 is preferably equipped with a first power bus 23, a second power bus 24, and a ground bus 25. First power bus 23, second power bus 24, and ground bus 25 are provided to chip logic area 21 of ASIC device 20 in a form of a power bus template. Each power bus template is preferably designed to fit a particular chip size, as it is understood by those skilled in the art. An I/O circuit can be placed in each of I/O slots 22, as desired by an ASIC designer.

When a specific power bus enhancement on a power bus template is needed to support a particular current (and noise) requirement of a particular I/O circuit, the prior art solution is to customize the power bus template of the entire chip. Such solution is not very cost-effective, not to mention very time-consuming. The present invention provides a library circuit element that can be automatically inserted into the I/O placement netlist to enhance the power bus of the I/O circuits such that custom work on the power bus template for the chip is eliminated.

Figure 3:
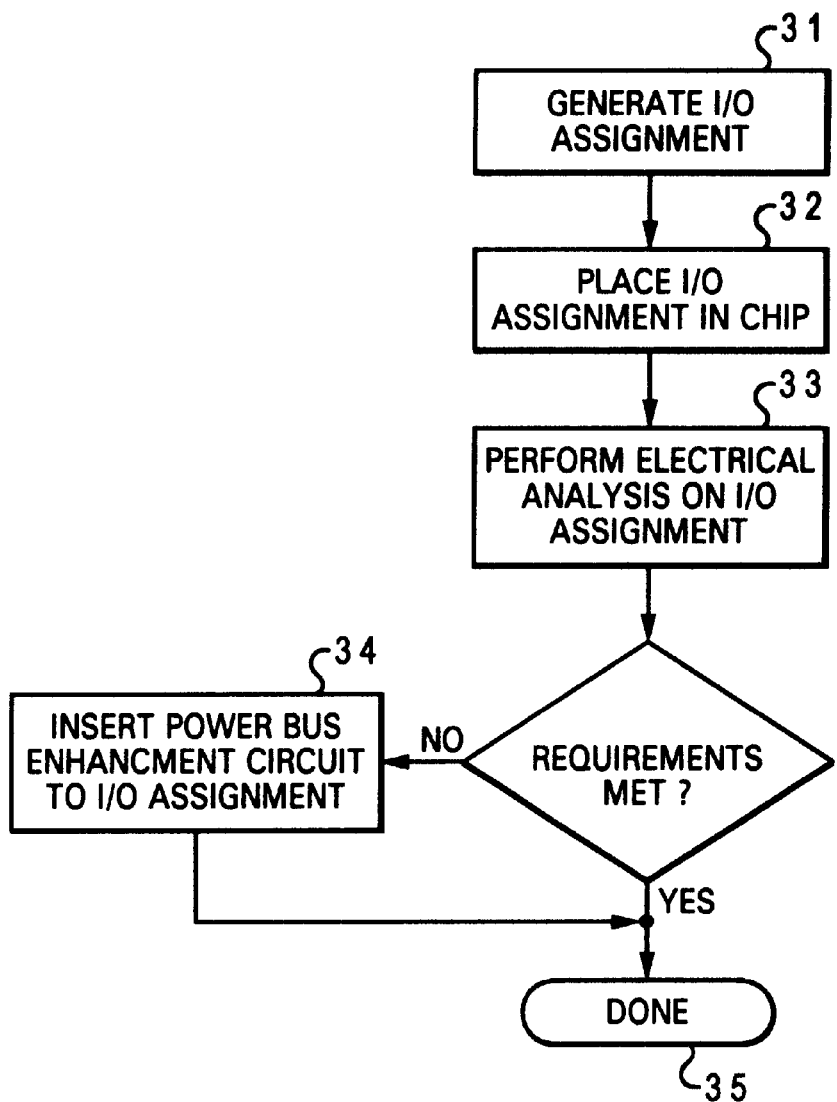
FIG. 3 is a high-level logic flow diagram for a method to enhance a power bus in I/O regions of an ASIC device, in accordance with a preferred embodiment of the present invention.
Figure 4:
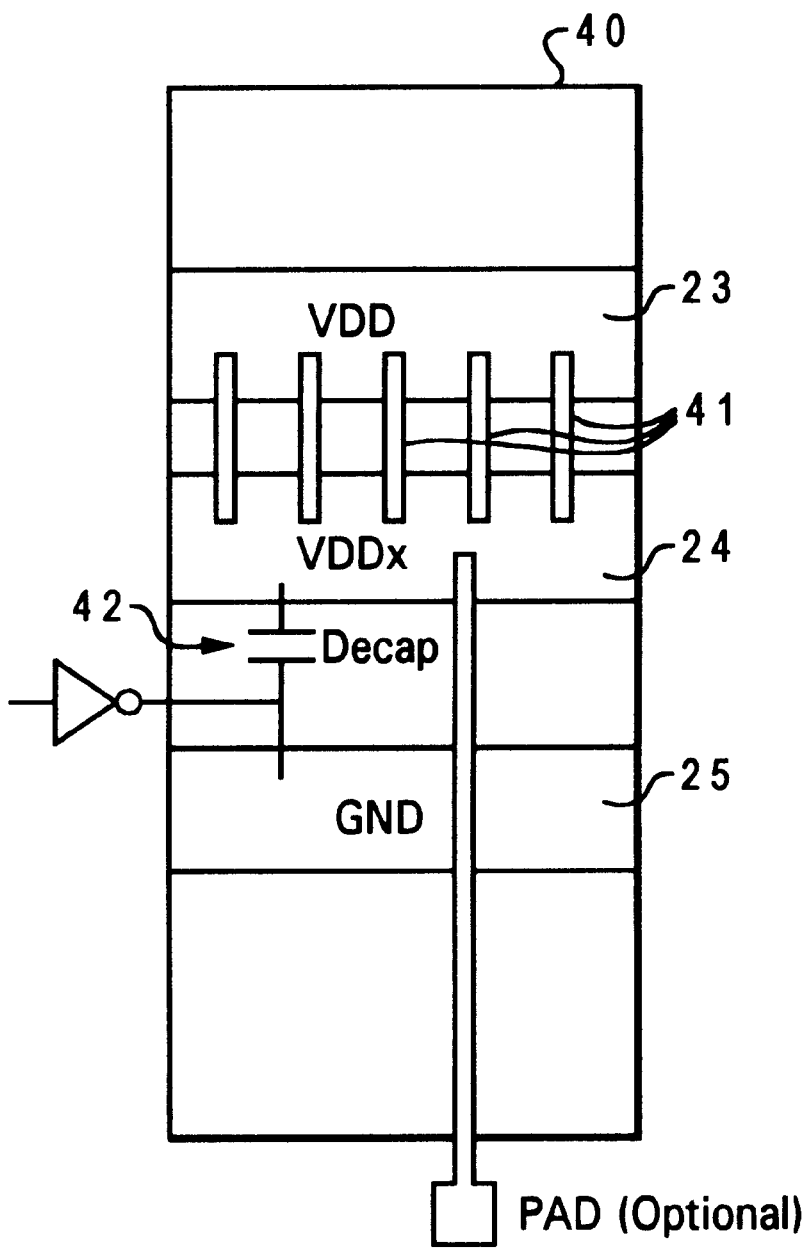
FIG. 4 is a block diagram of a power bus enhancement circuit, in accordance with a preferred embodiment of the present invention.

Referring now to FIG. 3, there is depicted a high-level logic flow diagram for a method to enhance a power bus in I/O circuits for ASIC designs, in accordance with a preferred embodiment of the present invention. Such method is performed during the floor planning stage and the I/O assignment stage of an ASIC design flow that are illustrated in block 15a and block 15b, respectively, from FIG. 1. First, an I/O assignment for I/O circuits that use a primary power bus or a secondary power bus is generated, as shown in block 31. The I/O slot locations and I/O circuit types are preferably included in the I/O assignment. The I/O assignment is then used in floor planning of chip logic, as depicted in block 32. Electrical analysis, such as I/O power bus loading, is then performed on the I/O assignment, as shown in block 33. If the requirements of the electrical analysis are met, then the process is completed, as depicted in block 35. Electrical analysis may includes a variety of requirements. For example, whether or not a $V_{dd}$ power bus is overloaded would be one of the requirements. Otherwise, if any of the requirements of the electrical analysis is not met, and the I/O circuit group not meeting requirements uses only the primary power supply ($V_{dd}$), then one or more power bus enhancement circuits are inserted into the I/O assignment at recommended intervals, as shown in block 34. A preferred embodiment of a power bus enhancement circuit is illustrated in FIG. 4. After the power bus enhancement circuit has been inserted, electrical analysis should be performed again, and changes made to the I/O assignment are reflected in the floor plan of the chip.

With reference now to FIG. 4, there is illustrated a block diagram of a power bus enhancement circuit, in accordance with a preferred embodiment of the present invention. As shown, a power bus enhancement circuit 40 includes multiple metal straps 41 for connecting a primary power bus, such as primary power bus 23, to a secondary power bus, such as secondary power bus 24, within an I/O slot. Metal straps 41 electrically connect primary power bus 23 to secondary power bus 24 in order to allow the power (or current) requirement of a group of I/O circuits to be met. In FIG. 4, a capacitor 42 is also added between secondary power bus 24 and a ground bus 25 within power bus enhancement circuit 40. Capacitor 42 is not required for power bus enhancement circuit 40 to function, but is added for providing additional decoupling capacitance to power buses 23, 24.

Figure 5:
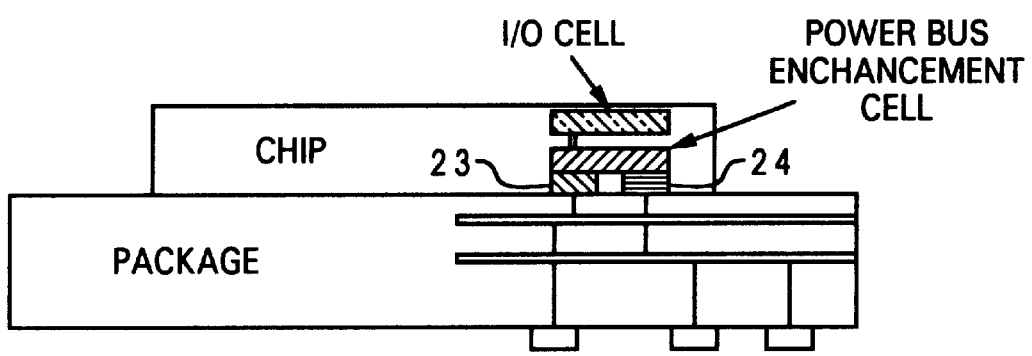
FIG. 5 is a block diagram of two power buses and package pads connected together to provide additional parallel power paths to a chip, in accordance with a preferred embodiment of the present invention.

Referring now to FIG. 5, there is illustrated a cross-sectional view of two power buses and package pads connected together to provide additional parallel power paths to an ASIC chip, in accordance with a preferred embodiment of the present invention. As shown, primary power bus 23 and secondary power bus 24 are connected together via a power bus enhancement circuit within an I/O slot 70. As a result, power supply noise and electromigration effects on the metal buses are reduced.

As has been described, the present invention provides a method for enhancing a power bus in I/O regions of an ASIC device without customization of the power bus template. The present invention provides an I/O circuit with a power bus enhancement circuit that connects a primary supply bus to a secondary supply bus to effectively double the current capability of the I/O power bus and to reduce the overall inductance. Such I/O circuit, which includes the power bus enhancement circuit, can be inserted in any I/O slot location on an ASIC chip to allow an ASIC designer the flexibility of enhancing the power bus where needed. In addition, with the present invention, the package pads connected to the secondary bus are available to bring more power to the primary bus through the package.

Figure 6:
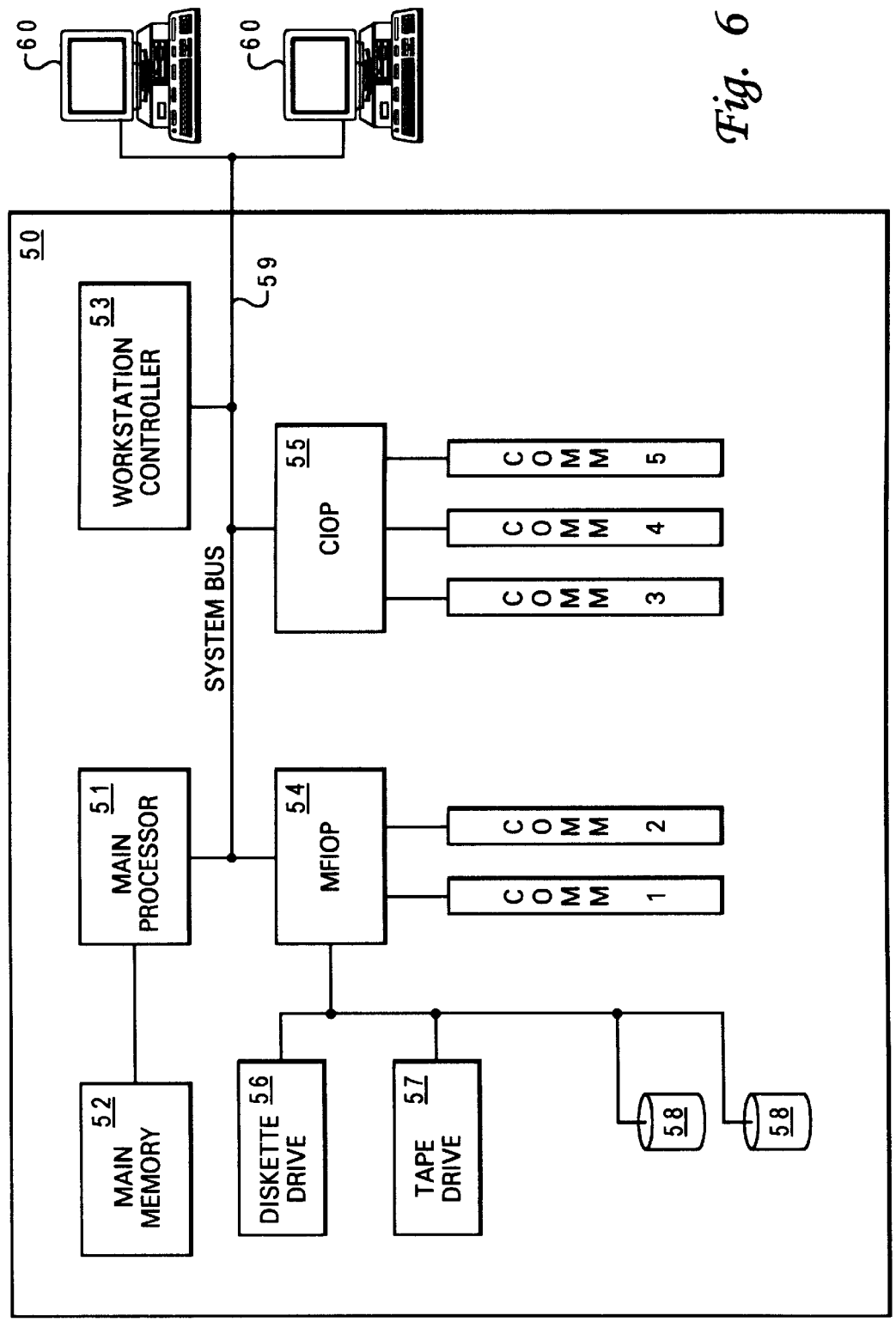
FIG. 6 is a block diagram of a computer system in which a preferred embodiment of the invention can be executed.

With reference now to FIG. 6, there is depicted a block diagram of a computer system in which a preferred embodiment of the invention can be executed. Within a computer system 50, a main processor 51 is coupled to a main memory 52 and to a multiple-function I/O processor (MFIOP) 54. Main processor 51 may include a single processor or multiple processors. Several peripheral storage devices such as a diskette drive 56, a tape drive 57, and direct access storage devices (DASDs) 58, are controlled by MFIOP 54. In addition, MFIOP 54 provides communications to other devices via communication ports such as COMM1 and COMM2.

Attached to a system bus 59 are a workstation controller 53 and a communications I/O processor (CIOP) 55. Workstation controller 53 provides communications between main processor 51 and workstations 60 that may be connected to computer system 50. CIOP 55 provides communications to other devices via communication ports such as COMM3, COMM4, and COMM5.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for enhancing a power bus in input/output (I/O) regions of an application specific integrated circuit (ASIC) design, said method comprising:

generating an I/O assignment for I/O circuits within an ASIC design, wherein said ASIC design includes a primary power bus and a secondary power bus;

determining whether or not said I/O assignment meets power bus distribution requirements; and in a determination that said I/O assignment does not meet said power bus distribution requirements, adding a power enhancement circuit, wherein said power enhancement circuit includes at least one metal line for connecting said primary power bus to said secondary power bus in order for said I/O assignment to meet said power bus distribution requirements.

2. The method of claim 1, wherein said power bus distribution requirements include electromigration or voltage drop.

3. A computer program product residing on a computer usable medium for enhancing a power bus in input/output (I/O) libraries in an application specific integrated circuit (ASIC) design, said computer program product comprising:

program code means for generating an I/O assignment for I/O circuits within an ASIC design, wherein said ASIC design includes a primary power bus and a secondary power bus;

program code means for determining whether or not said I/O assignment meets power bus distribution requirements; and program code means for adding a power enhancement circuit, in a determination that said I/O assignment does not meet said power bus distribution requirements, wherein said power enhancement circuit includes at least one metal line for connecting said primary power bus to said secondary power bus in order for said I/O assignment to meet said power bus distribution requirements.

4. The computer program product of claim 3, wherein said power bus distribution requirements include electromigration or voltage drop.

* * * * *